United States Patent
Tanaka et al.

[19]

[11] Patent Number: 6,121,681
[45] Date of Patent: *Sep. 19, 2000

[54] SEMICONDUCTOR DEVICE

[75] Inventors: Shigeru Tanaka, Fussa; Yasuhiro Nakamura, Tachikawa; Hitoshi Miwa, Ome; Kazuyuki Miyazawa, Hidaka, all of Japan

[73] Assignees: Hitachi, Ltd.; Hitachi ULSI Engineering Corp., both of Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/856,145

[22] Filed: May 14, 1997

[30] Foreign Application Priority Data

May 14, 1996 [JP] Japan ................................ 8-118899

[51] Int. Cl.⁷ .................................................. H01L 23/34
[52] U.S. Cl. ........................... 257/723; 257/724; 257/666; 257/787; 257/784; 257/678; 257/687; 257/636; 257/694; 361/760; 361/777; 361/761; 361/729; 361/728; 361/736; 361/737; 361/748
[58] Field of Search ...................... 257/666, 668, 257/676, 686, 690, 692, 694, 696, 698, 723, 777, 784, 786, 725, 678, 687, 724, 787; 361/760, 761, 777, 728, 729, 737, 736, 748

[56] References Cited

U.S. PATENT DOCUMENTS 5,469,333 11/1995 Ellerson et al. ...................... 361/779
5,484,959 1/1996 Burns ...................... 257/666

FOREIGN PATENT DOCUMENTS

0489643A1  6/1992  France .
2-335442   11/1990  Japan .
4-259365    9/1992  Japan .

OTHER PUBLICATIONS

Nikkei Microdevice, Jun. 1990, pp. 34–45. (with translation).

Primary Examiner—Steven H. Lore
Assistant Examiner—Luan Thai
Attorney, Agent, or Firm—Antonelli, Terry, Stout & Kraus, LLP

[57] ABSTRACT

A resin-encapsulated semiconductor package and a packaging structure, make it possible to provide for a high density mounting arrangement. Specifically, outer leads protrude from the two long sides of a rectangular package. The inner leads in the package, connected to the outer leads protruding from one long side, are connected through wires to the bonding pads of a semiconductor chip encapsulated in the package, whereas the inner leads in the package, connected to the outer leads protruding from the other long side, are in an electrically floating state in the package. The semiconductor packages are arranged in a direction on a card-shaped mounting board, and the opposed outer leads of adjoining semiconductor packages are electrically connected by wiring on the mounting board. The wirings are laid below the semiconductor packages so that they extend generally linearly.

31 Claims, 15 Drawing Sheets

| PIN DESCRIPTION | |
|---|---|
| PIN NAME | FUNCTION |
| I/O0-I/O7 | INPUT / OUTPUT |
| $\overline{CE}$ | CHIP ENABLE |
| $\overline{OE}$ | OUTPUT ENABLE |
| $\overline{WE}$ | WRITE ENABLE |
| $\overline{CDE}$ | COMMAND DATA ENABLE |
| Vcc | POWER SUPPLY |
| Vss | GROUND |
| R/$\overline{B}$ | READY / BUSY |
| $\overline{RES}$ | RESET |
| SC | SERIAL CLOCK |
| NC | NO CONNECT |

SEMICONDUCTOR DEVICE

BACKGROUND OF THE INVENTION

The present invention relates to a semiconductor device and, more particularly, to a technique which is effective when applied to the mounting of a plurality of semiconductor devices on the mounting face of a mounting board.

As a semiconductor device suitable for the reduced size or thickness of an electronic device, there is a semiconductor device having the TSOP (Thin Small Out-line Package) structure. In this semi-conductor device of the TSOP structure, for example, a semiconductor chip, constituted of a DRAM (Dynamic Random Access Memory), is encapsulated in a package made of resin.

This package is so formed as to have a rectangular plane shape. At and along one side face of the package, there are arranged a plurality of outer leads. These outer leads are individually so formed as to have a gull-wing shape and are individually connected electrically to a plurality of external terminals (bonding pads) arrayed on one side of a major surface of the semiconductor chip. On the other side face opposed to the one side face of the package, moreover, there are arrayed a plurality of outer leads. These outer leads are individually so formed as to have a gull-wing shape and are individually connected electrically with a plurality of external terminals which are arrayed on the other side of the principal face of the semiconductor chip. In short, the semiconductor device of TSOP structure is constructed of a two-way lead array structure in which a plurality of outer leads electrically connected to the semiconductor chip are individually arrayed on the two side faces of the package, opposed to each other.

Semiconductor devices of the TSOP structure thus constructed are regularly mounted over the mounting board of a memory card which is additionally connected to an electronic device such as a personal computer or office computer. This mounting is usually performed by printing the electrode pads (the land regions of the wiring), arranged over the mounting face of the mounting board, with pasty solder by a screen printing method, and by fixing the electrode pads of the mounting board and the outer leads of the semi-conductor devices with solder.

Incidentally, a semiconductor device of the TSOP structure is disclosed in Nikkei Maikurodevaisu [pp. 34 to 45, the June issue, 1990] issued by NIKKEI BP.

SUMMARY OF THE INVENTION

The aforementioned semiconductor device having a TSOP structure exibits the following problems because a plurality of outer leads, which are electrically connected to the external terminals of a semiconductor chip are individually arrayed on the two side faces of the package, opposed to each other.

(1) When semiconductor devices having a TSOP structure are mounted over the mounting face of the mounting board in a direction perpendicular to one side face of the package, the outer leads, electrically connected to the external terminals of the semiconductor chip, are opposed to each other between the adjoining semiconductor devices. In a memory card, therefore, considering the displacement of the semiconductor devices and the extrusion of the solder at the mounting time, a spacing region is provided between the outer leads of one semiconductor device and the outer leads of the other semiconductor device to prevent short-circuiting between the adjoining semiconductor devices. However, the spacing region as to be formed for every space between semiconductor devices so that the mounting density of the semi-conductor devices over the mounting board drops by a value corresponding to the areas of the spacing regions.

(2) When a plurality of semiconductor devices having a TSOP structure are mounted in a direction perpendicular to one side face of the package, between the adjoining semiconductor devices, the outer leads arrayed on one side face of the package of one semiconductor device are present between the outer leads arrayed on the other side face of the package of the one semiconductor device and the outer leads arranged on the one side face of the package of the other semiconductor device. In short, between the outer leads having the same functions, there are present other outer leads which have different functions. In the memory card, therefore, the wiring existing over the mounting board is routed in a roundabout way to electrically connect the outer leads having the same functions of the individual semiconductor devices. However, such wiring increases the area occupied by the wiring so that the mounting density of the semiconductor devices over the mounting board drops by a value corresponding to the increase in the area.

An object of the present invention is to provide a semiconductor device which can accommodate mounting at a high density.

The aforementioned and other objects and novel features of the present invention will become apparent from the following description to be made with reference to the accompanying drawings.

The summary of representative aspects of the invention to be disclosed will be briefly described in the following.

Semiconductor devices mounted on the mounting face of a mounting board have a structure in which each semiconductor chip is encapsulated in a package having a rectangular plane shape, in which a plurality of outer leads electrically connected to external terminals of the semiconductor chip are arrayed on one side face of the package, and in which a plurality of outer leads not electrically connected to the external terminals of the semiconductor chip are arrayed on the other side face opposed to the one side face of the package.

According to the above-specified arrangement, when these semiconductor devices are mounted on the mounting face of the mounting board and arranged in a direction perpendicular to one side face of the package, between the semiconductor devices adjoining in that direction, the outer leads arrayed on one side face of the package of one semiconductor device and the outer leads arrayed on the other side face of the package of the other semiconductor device are opposed to each other. However, the outer leads of the one semiconductor device are electrically connected to the external terminals of the semiconductor chip, but the outer leads of the other semiconductor device are not electrically connected to the external terminals of the semi-conductor chip, so that the outer leads electrically connected to the external terminals of the semiconductor chip are not opposed to each other. As a result, even if the spacing region between the outer leads of the one semiconductor device and the outer leads of the other semiconductor device is reduced or eliminated and if the semiconductor devices are displaced or have extrusion of solder at the packaging time, no short-circuiting takes place between the adjoining ones of the semiconductor devices which are mounted in the direction perpendicular to one side face of the package. As a result, the spacing region between the outer leads of one semiconductor device and the outer leads of the other semiconductor device can be reduced or eliminated to mount the semiconductor devices over the mounting board at an accordingly high density.

When semiconductor devices are mounted on the mounting face of the mounting board in a direction perpendicular to one side face of the package, between the adjoining semiconductor devices, there are arranged, between the outer leads arrayed on one side face of the package of one semiconductor device and the outer leads arrayed on one side face of the package of the other semiconductor device, outer leads which are arrayed on the other side face of the package of the one semiconductor device. However, these outer leads arrayed on the other side face of the package of the one semiconductor device are not electrically connected to the external terminals of the semiconductor chip so that there are no outer leads between the outer leads of the one semiconductor device and the outer leads of the other semiconductor device which have different functions. Without routing the wiring extending over the mounting board in a roundabout way, therefore, it is possible to electrically connect outer leads having the same functions of the individual semiconductor devices which are mounted in a direction perpendicular to one side face of the package. As a result, the wiring region can be reduced or eliminated to enable mounting of the semiconductor devices in an accordingly high density.

DESCRIPTION OF THE PREFERRED EMBODIMENTS

Figure 1:
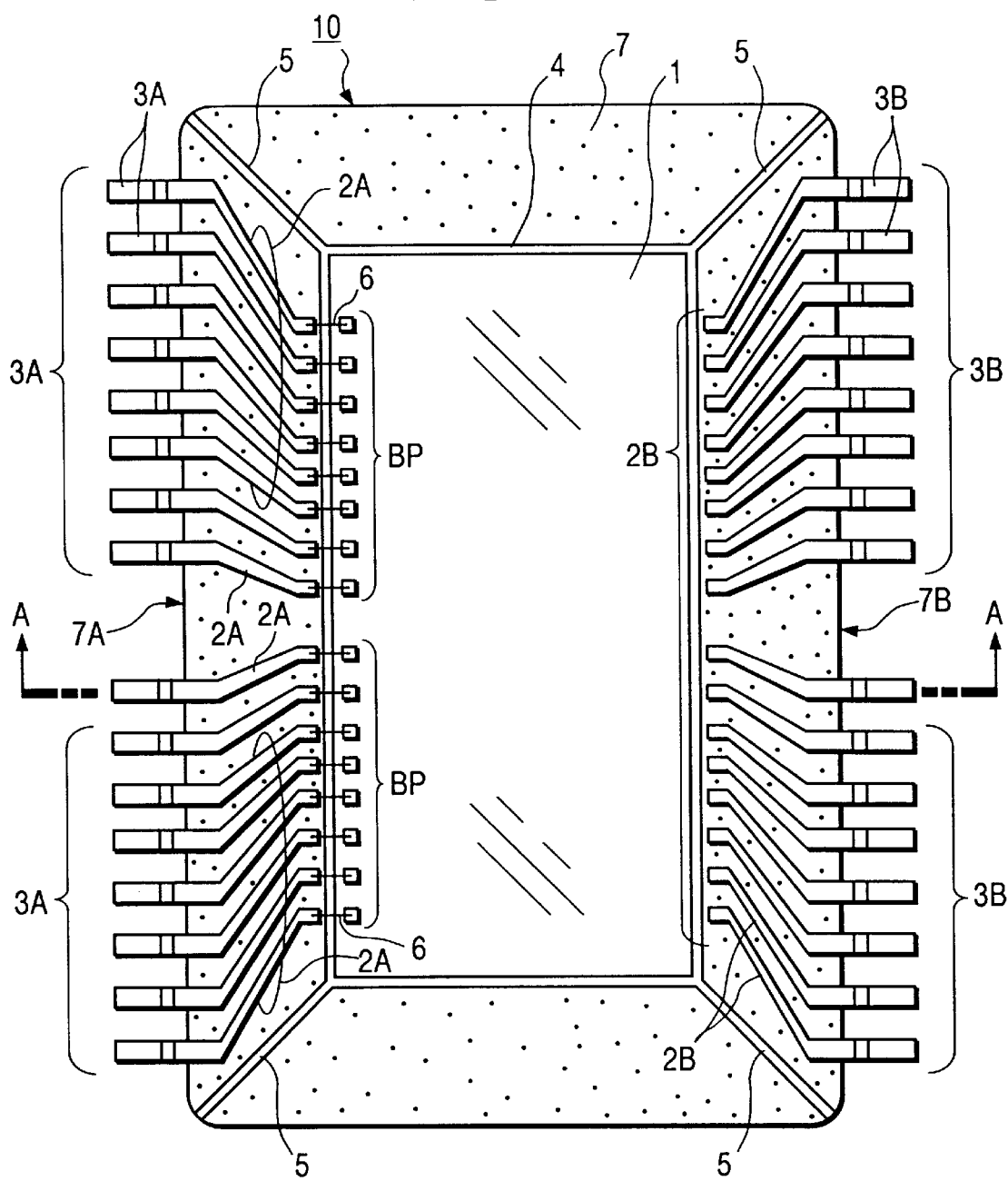
FIG. 1 is a top plan view showing the state in which the upper portion of the package of a semiconductor device of Embodiment 1 of the present invention is removed.

The embodiments of the present invention will be described in detail with reference to the accompanying drawings.

Incidentally, throughout all the drawings illustrating the embodiments of the present invention, parts and portions having the same functions will be designated by common reference numerals while omitting their repeated description.

(Embodiment 1)

Figure 2:
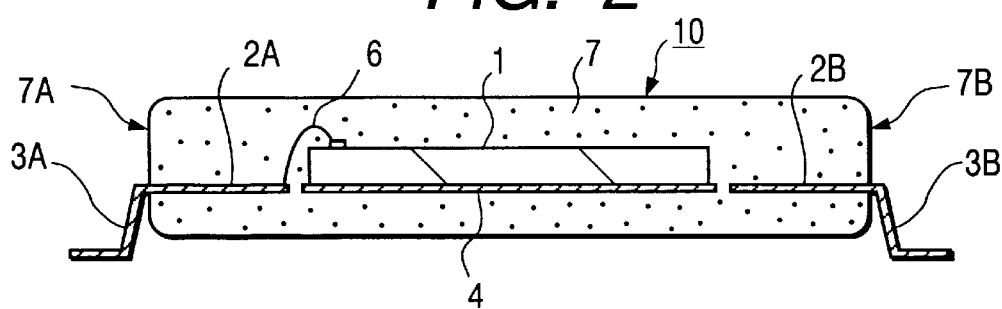
FIG. 2 is a section taken along line A—A shown in FIG. 1.

FIG. 1 is a top plan view showing the state in which the upper portion of the package of a semiconductor device of Embodiment 1 of the present invention is removed, and FIG. 2 is a section taken along line A—A shown in FIG. 1.

As shown in FIGS. 1 and 2, a semiconductor device 10 of the present embodiment has a TSOP (Thin Small Out-line Package) structure. This semiconductor device 10 has a semiconductor chip 1 mounted on one surface of a tab 4 which is supported by four tab-suspension leads 5. The semiconductor chip 1 is fixed, although not shown, to one surface of the tab 4 through an adhesive layer of Ag paste or the like.

The aforementioned semiconductor chip 1 is constructed mainly of a semiconductor substrate which is a single-crystal silicon substrate having a rectangular plane shape. In the major surface (element forming surface) of the semiconductor substrate, there is constructed a DRAM (Dynamic Random Access Memory) as a memory circuit system, for example. Over the major surface of the semiconductor substrate, moreover, there is formed a multilayer wiring layer in which plural stages of wiring layers and insulating layers are individually stacked.

On one side (one long side) of the major surface of the aforementioned semiconductor chip 1, there are arrayed a plurality of external terminals (bonding pads) BP extending along the one side. These external terminals BP are individually formed in the uppermost wiring layer of the multilayer wiring and are electrically connected to the memory circuit system.

Outside the one side of the semiconductor chip 1, there are arrayed a plurality of inner leads 2A extending along the one side. These inner leads 2A are individually connected electrically through bonding wires 6 to the external terminals BP which are arrayed on the one side of the major surface of the semiconductor chip 1.

Outside the other side (the other long side) opposed to the one side of the semiconductor chip 1, there are arrayed a plurality of inner leads 2B extending along the other side. These inner leads 2B are not individually connected electrically to the external terminals BP of the semiconductor chip 1.

The aforementioned semiconductor chip 1, inner leads 2A, inner leads 2B, tabs 4, tab suspension leads 5 and bonding wires 6 are encapsulated in a package 7 so formed as to have a rectangular plane shape. This package 7 is formed by a transfer molding method, for example, although the invention is not limited thereto. The transfer molding method is a technique for forming a package with an epoxy resin to which are added a phenol curing agent, silicone rubber and a filler.

On one side face 7A of the aforementioned package 7, there are arranged a plurality of outer leads 3A extending along the side face. On the other side face 7B opposed to the one side face 7A of the package 7, there are also arrayed a plurality of outer leads 3B extending along the side face. These outer leads 3A and 3B are individually formed into a gull-wing shape.

The aforementioned outer leads 3A are individually integrated with the inner leads 2A which are arrayed outside the one side of the semiconductor chip 1. Moreover, the aforementioned outer leads 3B are individually integrated with the inner leads 2B which are arrayed outside the other side of the semiconductor chip 1. In short, the semiconductor device 10 of the present embodiment is constructed of a bidirectional lead array structure in which the outer leads 3A electrically connected to the external terminals BP of the semiconductor chip 1 are arrayed on and along the one side face 7A of the package 7, whereas the outer leads 3B not electrically connected to the external terminals BP of the semiconductor chip 1 are arranged at and along the other side face 7B opposed to the one side face of the package 7.

The aforementioned outer leads 3A, outer leads 3B and tab suspension leads 5 are individually integrated with the lead frame at a step of manufacturing the semiconductor device. These outer leads 3A and 3B and tab suspension leads 5 are individually cut from the lead frame after the inner leads 2A and 2B, the tabs 4, the tab suspension leads 5 and the bonding wires 6 are encapsulated in the package 7. After this, the outer leads 3A and 3B are individually formed into the gull-wing shape. Incidentally, the lead frame is made of a Cu alloy or an Fe-Ni (having 42 or 50 [%] of Ni content, for example) alloy, for example.

To the aforementioned outer leads 3A and outer leads 3B, there are applied an address signal, a row-address strobe signal, a column-address strobe signal, an output enable signal, a write enable signal and a data input/output signal.

Figure 11:
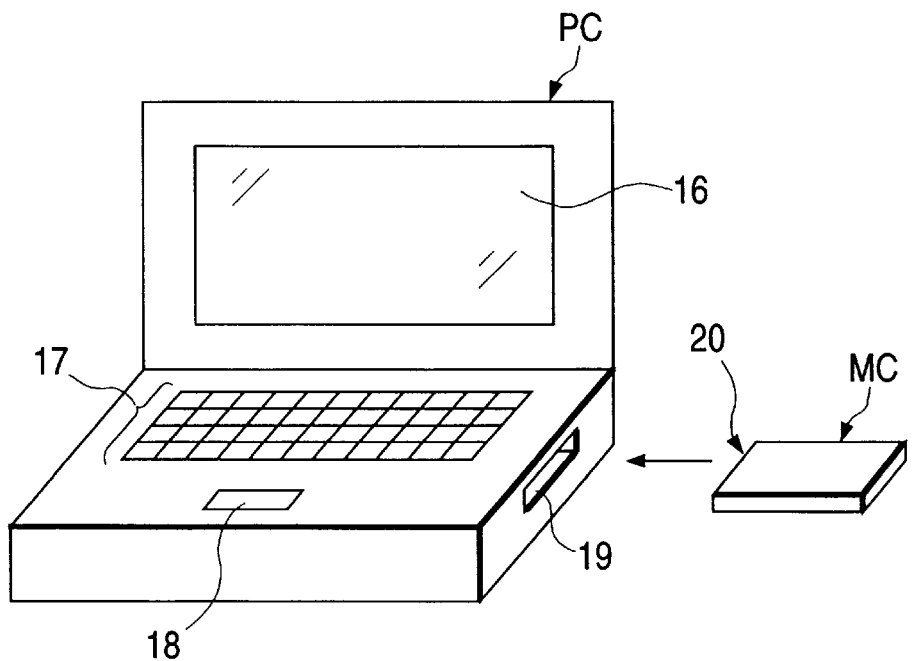
FIG. 11 is a perspective view showing an electronic device to which is applied the memory card MC of the present invention.

A plurality of semiconductor devices 10 thus constructed are regularly arranged as one memory system, as shown in FIG. 11, on a mounting board of a memory card (an electronic unit) MC which is additionally connected to an electronic device PC, such as a personal computer or an office computer. This mounting is usually carried out by applying pasty solder by a screen printing method to the electrode pads (the land regions of the wiring) which are arranged on the mounting face of the mounting board, and by fixing the electrode pads of the mounting board and the outer leads of the semiconductor device 10 with solder.

The electronic device PC is equipped with a liquid crystal display 16, a keyboard 17, a control pad 18, and a slot 19 for receiving the memory card MC.

When the connector side 20 of the memory card MC is inserted into the slot 19, data such as graphic data are transferred between the electronic device PC and the memory card MC.

Figure 12:
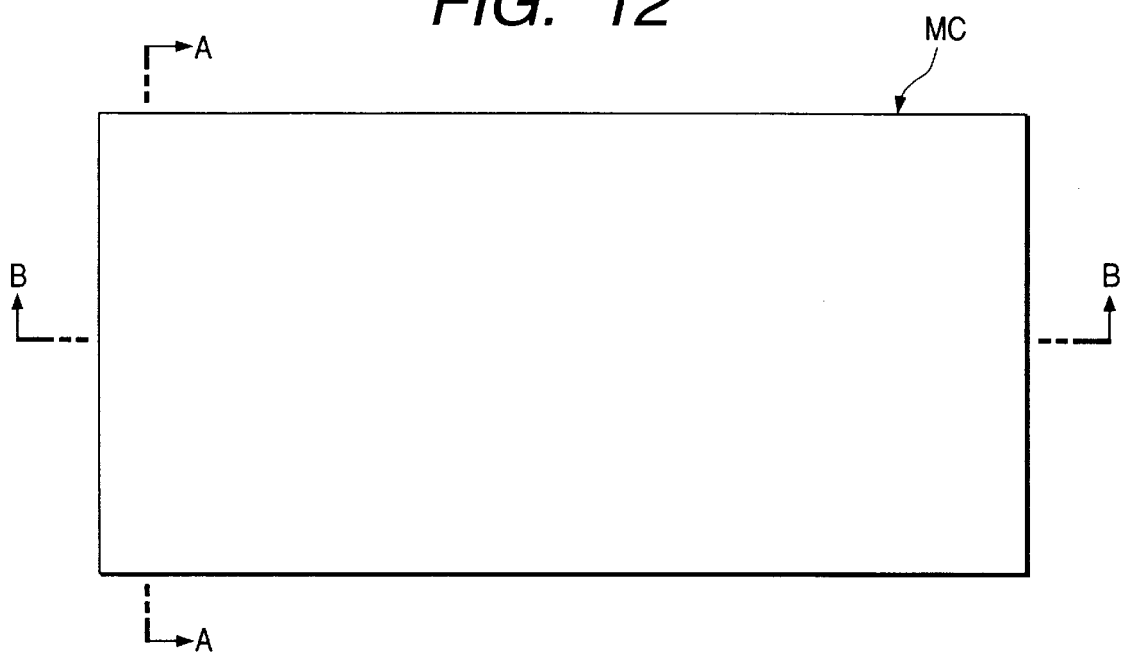
FIG. 12 is a top plan view showing the memory card MC.
Figure 13:
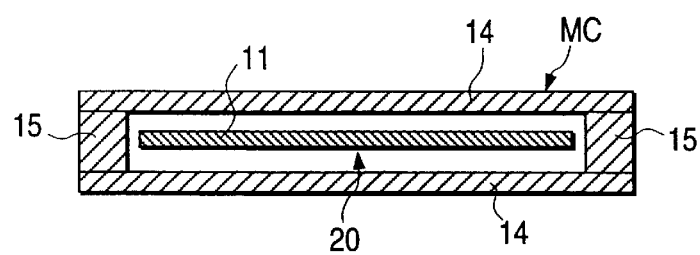
FIGS. 13 and 14 are sections taken along lines A—A and B—B respectively of FIG. 12.
Figure 14:
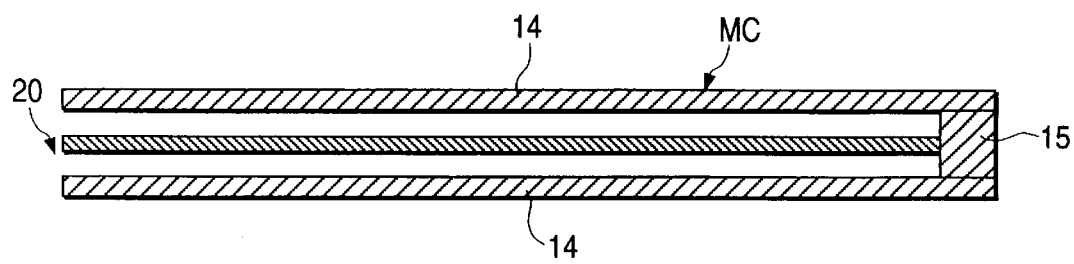

This memory card MC is formed, as shown in FIGS. 12, 13 and 14, into a hollow structure having a generally rectangular plate shape, for example, by sandwiching an outer frame 15 of plastic between covers 14 of stainless steel. In this structure, there is arranged the mounting board 11, one edge of which is fixed to the outer frame 15. The body of the memory card MC is constructed by mounting a plurality of semiconductor devices, as will be described with reference to FIGS. 3 and 4, on the mounting board 11.

Figure 3:
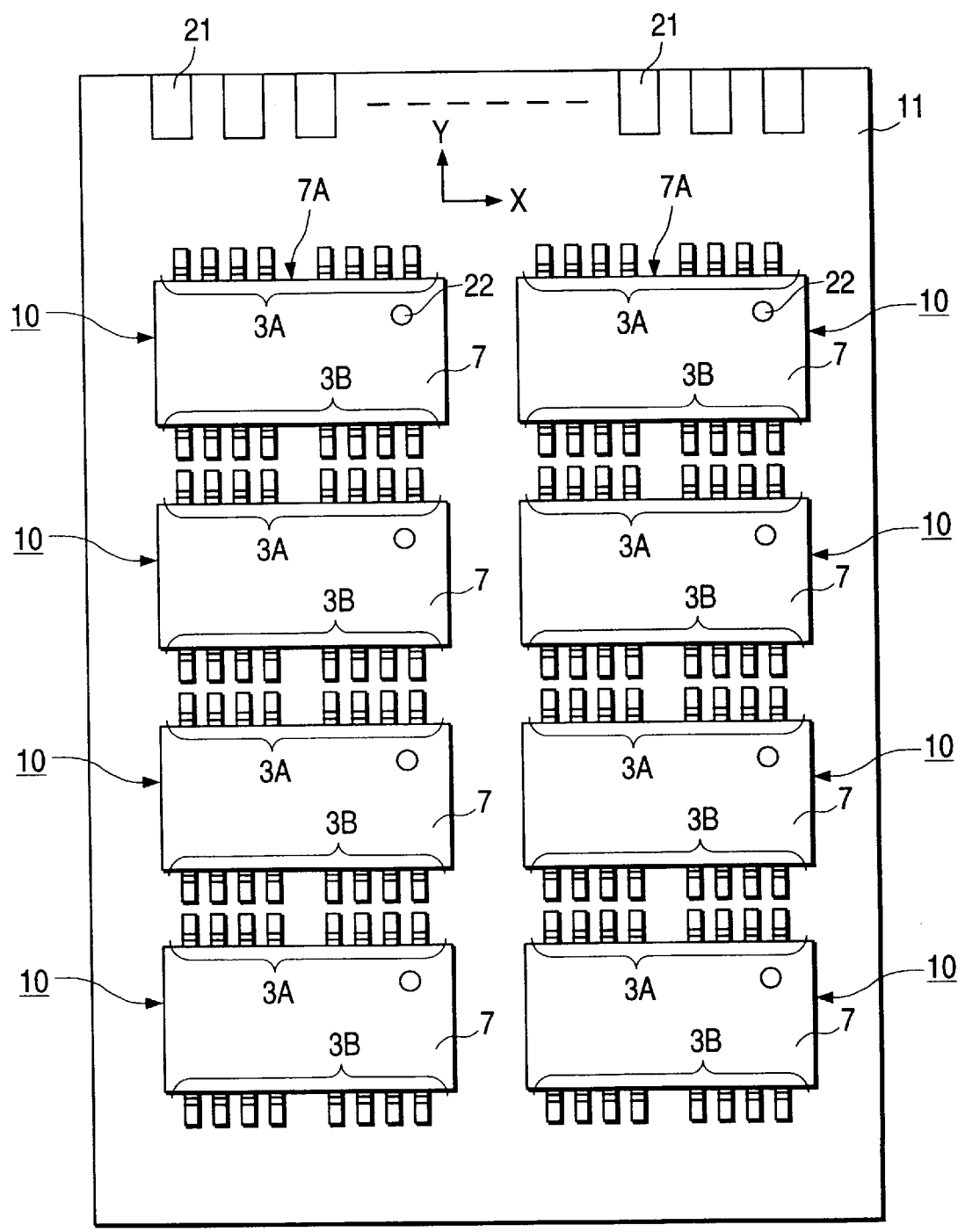
FIG. 3 is a top plan view showing a memory card in which semiconductor devices are mounted on the mounting face of a mounting board.
Figure 4:
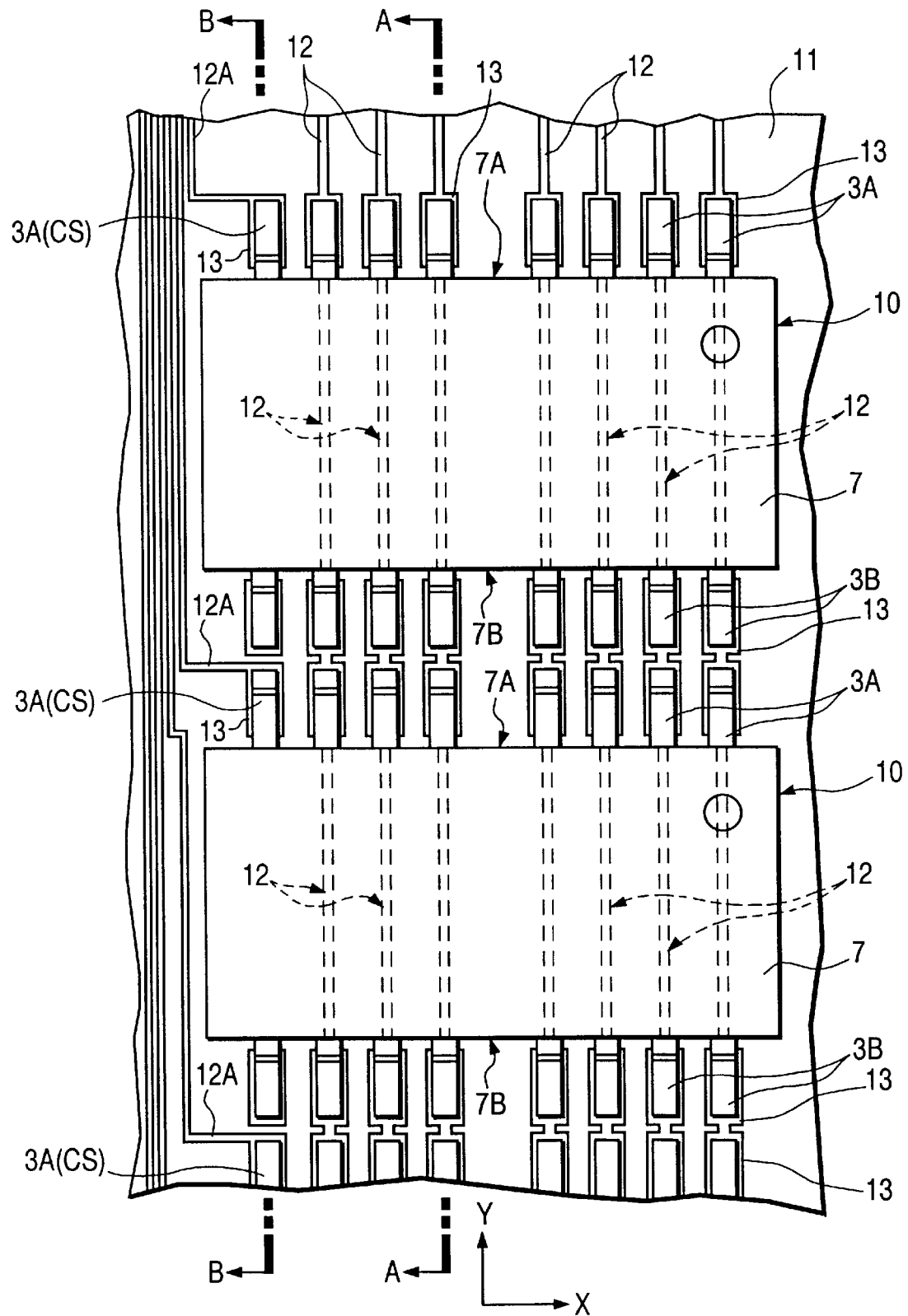
FIG. 4 is an enlarged top plan view showing an essential portion of the memory card.
Figure 10A:
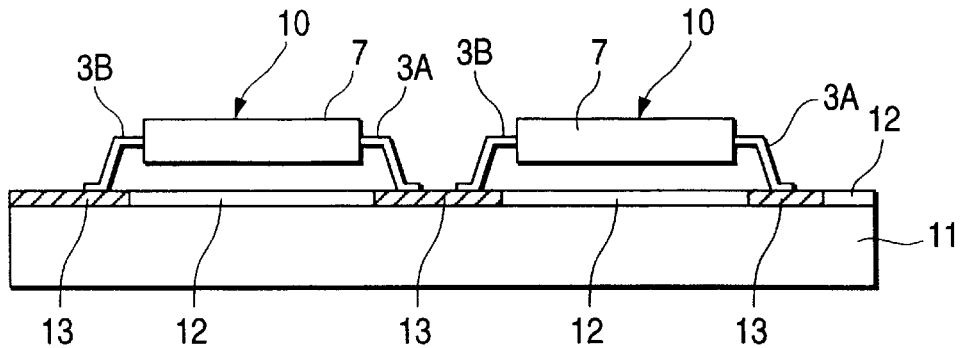
FIG. 10(A) is a section taken along line A—A of FIG. 4.
Figure 10B:
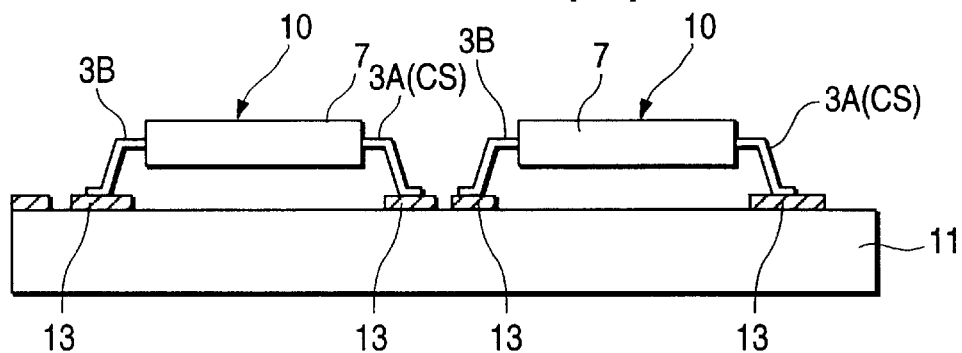
FIG. 10(B) is a section taken along line B—B of FIG. 4.

In the aforementioned memory card (electronic unit), as shown in FIG. 3 (a top plan view), a plurality of semiconductor devices 10 are directionally arranged and mounted in a matrix shape on the mounting face of a mounting board 11. In order to recognize the mounting direction of the individual semiconductor devices 10, marks 22 are provide on the surface of the package 7. Incidentally, reference numeral 21 designates connector terminals for connection with the electronic device PC. Of these semiconductor devices 10, the semiconductor devices 10 mounted in the direction (Y-direction) perpendicular to the one side face 7A of the package 7, are shown in FIG. 4 (an enlarged top plan view of an essential portion of FIG. 3). Between two adjoining semiconductor devices 10, the outer leads 3A arrayed on the one side face 7A of the package 7 of one semiconductor device 10, and the outer leads 3B arrayed on the other side face 7B of the package 7 of the other semiconductor device 10 are opposed to each other. However, the outer leads 3A of the one semiconductor device 10 are electrically connected to the external terminals BP of the same semiconductor device 10, but the outer leads 3B of the other semiconductor device 10 are not electrically connected to the external terminals BP of the same semiconductor chip 1, so that the outer leads 3A electrically connected to the external terminals BP of the semiconductor chips 1 are not opposed to each other. As a result, even if the spacing region between the outer leads 3A of the one semiconductor device 10 and the outer leads 3B of the other semiconductor device 10 is reduced or eliminated and if the semiconductor devices 10 are displaced or extrusion of the solder occurs at the mounting time, no short-circuiting takes place between adjoining semiconductor devices 10 which are mounted in the direction perpendicular to the one side face 7A of the package 7. In other words, in order to electrically isolate the adjoining leads 3A and 3B between the adjoining semiconductor devices 10, lands 13 (foot prints) formed on the mounting board 11 are arranged, considering predetermined spacings (the positioning allowance of the leads and the extrusion width of solder). In the case of the present embodiment, as shown in FIGS. 10(A) and 10(B), the adjoining lands 13 of the wiring 12 can be formed with spacings less than the aforementioned predetermined spacings or integrated with no spacing. Moreover, the wiring 12 can be generally linearly formed below the package 7 to improve the mounting efficiency.

Between the adjoining ones of the semiconductor devices 10 mounted in the direction (Y-direction) perpendicular to the one side face 7A of the package 7, the outer leads 3B arrayed on the other side face 7B of the package 7 of one semiconductor device 10 are provided between the outer leads 3A arrayed on the one side face 7A of the package 7 of the one semi-conductor device 10, and the outer leads 3A arrayed on the side face 7A of the package 7 of the other semiconductor device 10. However, the outer leads 3B arrayed on the other side face 7B of the package 7 of the one semiconductor device 10 are not electrically connected to the external terminals BP of the same semiconductor chip 1, so that there are no outer leads between the outer leads 3A of the one semiconductor device 10 and the outer leads 3A of the other semiconductor device 10 having functions different from those of the outer leads 3A. As a result, for the leads, such as chip select leads 3A (CS) which must be electrically independent, roundabout routed wiring 12A is required. For the other common signal leads or power supply leads, however, without roundabout routing of the wiring 12 extending over the mounting board 11, it is possible to electrically connect the outer leads 3A having the same functions of the individual semiconductor devices 10 mounted in the direction perpendicular to the one side face 7A of the package 7, through the generally straight wiring 12.

Thus, the following effects can be achieved in the present embodiment.

(1) Semiconductor devices 10 mounted on the mounting face of the mounting board 11 have a structure in which the semiconductor chip 1 is packaged in a package 7 having a rectangular plane shape, a plurality of outer leads 3A electrically connected to the external terminals BP of the semiconductor chip 1 are arrayed along one side face of the package 7, and a plurality of outer leads 3B not electrically connected to the external terminals BP of the semiconductor chip 1 are arrayed along the other side face 7B opposed to the one side face 7A of the package 7. When these semiconductor devices 10 are mounted on the mounting face of the mounting board 11 and arranged in a direction perpendicular to the one side face 7A of the package 7, between the semiconductor devices 10 adjoining in the direction of alignment, the outer leads 3A arrayed on the one side face 7A of the package 7 of the one semiconductor device 10 and the outer leads 3B arrayed on the other side face 7B of the package 7 of the other semiconductor device 10 are opposed to each other. However, the outer leads 3A of the one semiconductor device 10 are electrically connected to the external terminals BP of the semiconductor chip 1, but the outer leads 3B of the other semiconductor device 10 are not electrically connected to the external terminals BP of the semiconductor chip 1, so that the outer leads 3A electrically connected to the external terminals BP of the semiconductor chip 1 are not opposed to each other. As a result, even if the spacing region between the outer leads 3A of the one semiconductor device 10 and the outer leads 3B of the other semiconductor device 10 is reduced or eliminated and if the semiconductor devices 10 are displaced or extrusion of the solder occurs at the mounting time, no short-circuit takes place between the adjoining ones of the semiconductor devices 10 which are mounted in the direction perpendicular to the one side face 7A of the package 7. As a result, the spacing region between the outer leads 3A of the one semiconductor device 10 and the outer leads 3B of the other semiconductor device 10 can be reduced or eliminated to mount the semiconductor devices 10 on the mounting board 11 in an accordingly high density.

Moreover, when the semiconductor devices 10 are arranged in the direction perpendicular to the one side face 7A of the package 7 and mounted on the mounting face of the mounting board 11, between the semiconductor devices 10 adjoining in that direction, the outer leads 3B arrayed on the other side face 7B of the package 7 of one semiconductor device 10 are present between the outer leads 3A arrayed on the one side face 7A of the package 7 of the one semiconductor device 10 and the outer leads 3A arrayed on the on side face 7A of the package 7 of the other semiconductor device 10. However, the outer leads 3B arrayed on the other side face 7B of the package 7 of the one semiconductor device 10 are not electrically connected to the external terminals BP of the same semiconductor chip 1, so that there is not present any outer leads between the outer leads 3A of the one semiconductor device 10 and the outer leads 3A of the other semiconductor device 10 having functions different from those of the outer leads 3A. As a result, without roundabout routing of the wiring 12 extending in the Y-direction on the mounting board 11, it is possible to electrically connect the outer leads 3A having the same functions of the individual semiconductor devices 10 mounted in the direction perpendicular to the one side face 7A of the package 7. As a result, the wiring region can be reduced or eliminated, making it possible to mount the semiconductor devices 10 at an accordingly high density on the mounting board 11.

By means of the outer leads 3A arranged on the one side face 7A of the package 7 and the outer leads 3B arrayed on the other side face 7B of the package 7, moreover, the semiconductor devices 10 can be stably fixed to the mounting board 11 thereby to enhance the shock resistance of the semiconductor devices 10.

(2) In the memory card (electronic unit), a plurality of semiconductor devices 10 each having a structure in which a semiconductor chip 1 is encapsulated in a package 7 having a rectangular plane shape, a plurality of outer leads 3A, electrically connected to the external terminals BP of the semiconductor chip 1 arrayed on the one side face of the package 7, and a plurality of outer leads 3B not electrically connected to the external terminals BP of the semiconductor chip 1 and arrayed on the other side face 7B opposed to the one side face 7A of the package 7, are mounted on the mounting face of the mounting board 11 in a direction perpendicular to the one side face 7A of the package 7. Between the adjoining semiconductor devices 10, therefore, the spacing region between the outer leads 3A of the one semiconductor device 10 and the outer leads 3B of the other semiconductor device 10 can be reduced or eliminated to reduce the planar area size of the memory card correspondingly. Without roundabout routing of the wiring 12 extending on the mounting board 11, moreover, the outer leads 3A having the same functions of the individual semiconductor devices 10 arranged in a direction perpendicular to the one side face 7A of the package 7 can be electrically connected. As a result, the area of the wiring 12 can be reduced or eliminated to reduce the size of the memory card correspondingly.

(Embodiment 2)

Figure 5:
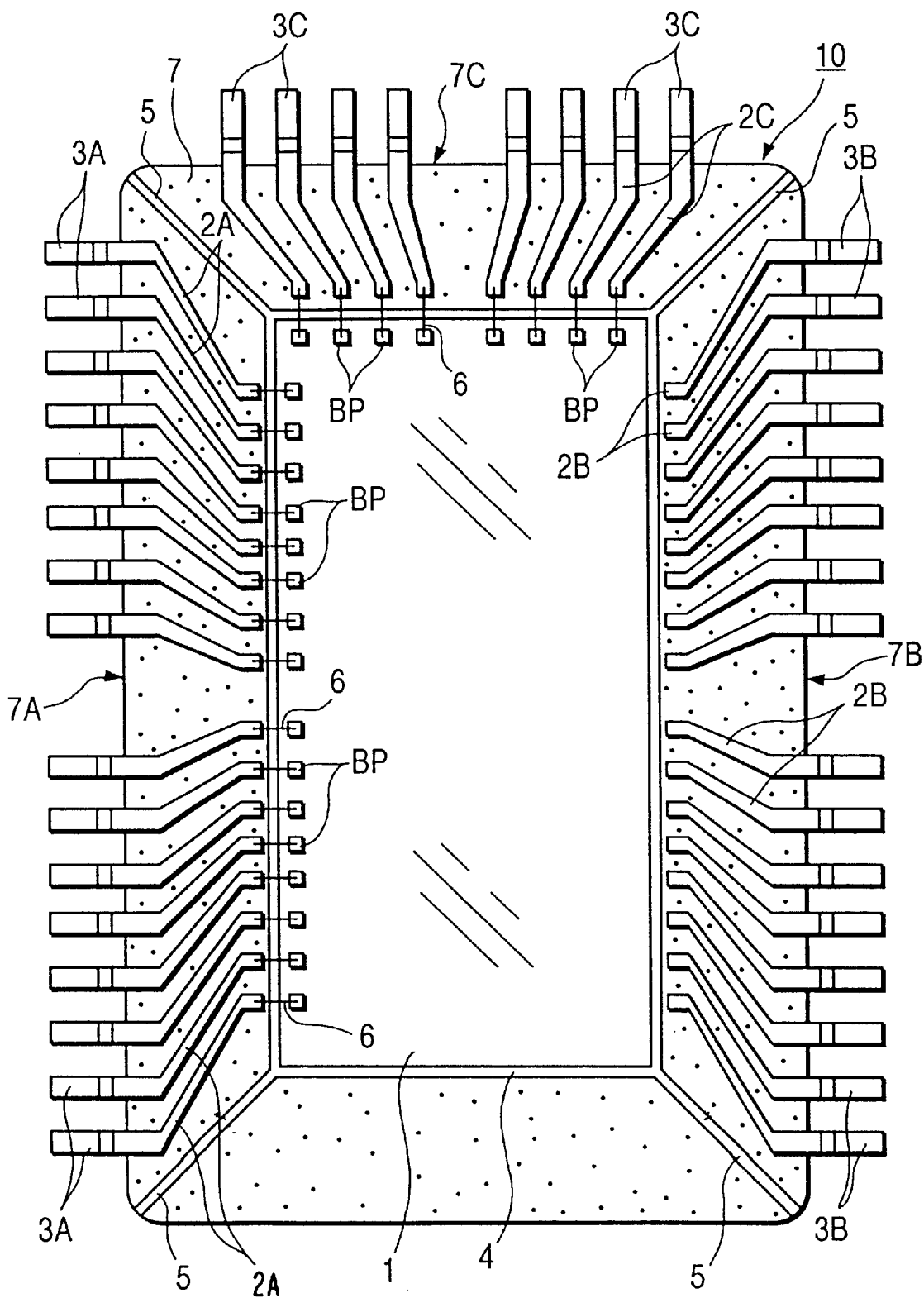
FIG. 5 is a top plan view showing the state in which the upper portion of the package of a semiconductor device of Embodiment 2 of the present invention is removed.

FIG. 5 is a top plan view showing the state in which the upper portion of the package of a semiconductor device of Embodiment 2 of the present invention is removed.

As shown in FIG. 5, a semiconductor device 10 of the present embodiment is constructed so as to have a TSOP structure. In this semiconductor device 10 having a TSOP structure, a semiconductor chip 1 is mounted on one surface of a tab 4 which is supported by four tab suspension leads 5.

A plurality of inner leads 2A are arrayed outside and along one side of the semiconductor chip 1. These individual inner leads 2A are electrically connected through bonding wires 6 to external terminals BP which are arrayed on the one side of the major surface of the semiconductor chip 1.

A plurality of inner leads 2B are arrayed outside and on the other side (the other long side) opposed to the one side of the semiconductor chip 1. These individual inner leads 2B are not electrically connected to the external terminals BP of the semiconductor chip 1.

Outside and along one of the two sides perpendicular to the one side of the semiconductor chip 1, there are arrayed a plurality of inner leads 2C. These individual inner leads 2C are electrically connected through bonding wires 6 to a plurality of external terminals BP which are arrayed on one of the two sides perpendicular to the one side of the major surface of the semiconductor chip 1.

The aforementioned semiconductor chip 1, inner leads 2A, inner leads 2B, inner leads 2C, tab 4, tab suspension leads 5 and bonding wires 6 are encapsulated in a package 7 which is so formed as to have a rectangular plane shape.

A plurality of outer leads 3A are arrayed on one side face 7A of the package 7. A plurality of outer leads 3B are arrayed on the other side face 7B opposed to the one side face 7A of the package 7. A plurality of outer leads 3C are arrayed on one side face 7C of the two side faces perpendicular to the long side faces of the package 7. These outer leads 3A, 3B and 3C are formed into a gull-wing shape.

The outer leads 3A are individually integrated with the inner leads 2A which are arrayed outside the one side of the semiconductor chip 1. Moreover, the outer leads 3B are individually integrated with the inner leads 2B which are arrayed outside the other side of the semiconductor chip 1. Moreover, the outer leads 3C are individually integrated with the inner leads 2C which are arrayed outside one of the two sides perpendicular to the long sides of the semiconductor chip 1. In other words, the semiconductor device 10 of the present embodiment has a three-way lead array structure in which the outer leads 3A electrically connected to the external terminals BP of the semiconductor chip 1 are arrayed on the one side face 7A of the package 7, the outer leads 3B not electrically connected to the external terminals BP of the semiconductor chip 1 are arrayed on the other side face 7B opposed to the one side face 7A of the package 7, and the outer leads 3C electrically connected to the external terminals BP of the semiconductor chip 1 are arrayed on the one side face 7C of the two side faces perpendicular to the long side face 7A of the package 7.

A plurality of semiconductor devices 10 thus constructed are regularly arranged on the mounting board of the memory card (electronic unit) which is additionally connected to an electronic device, such as a personal computer or an office computer.

Figure 6:
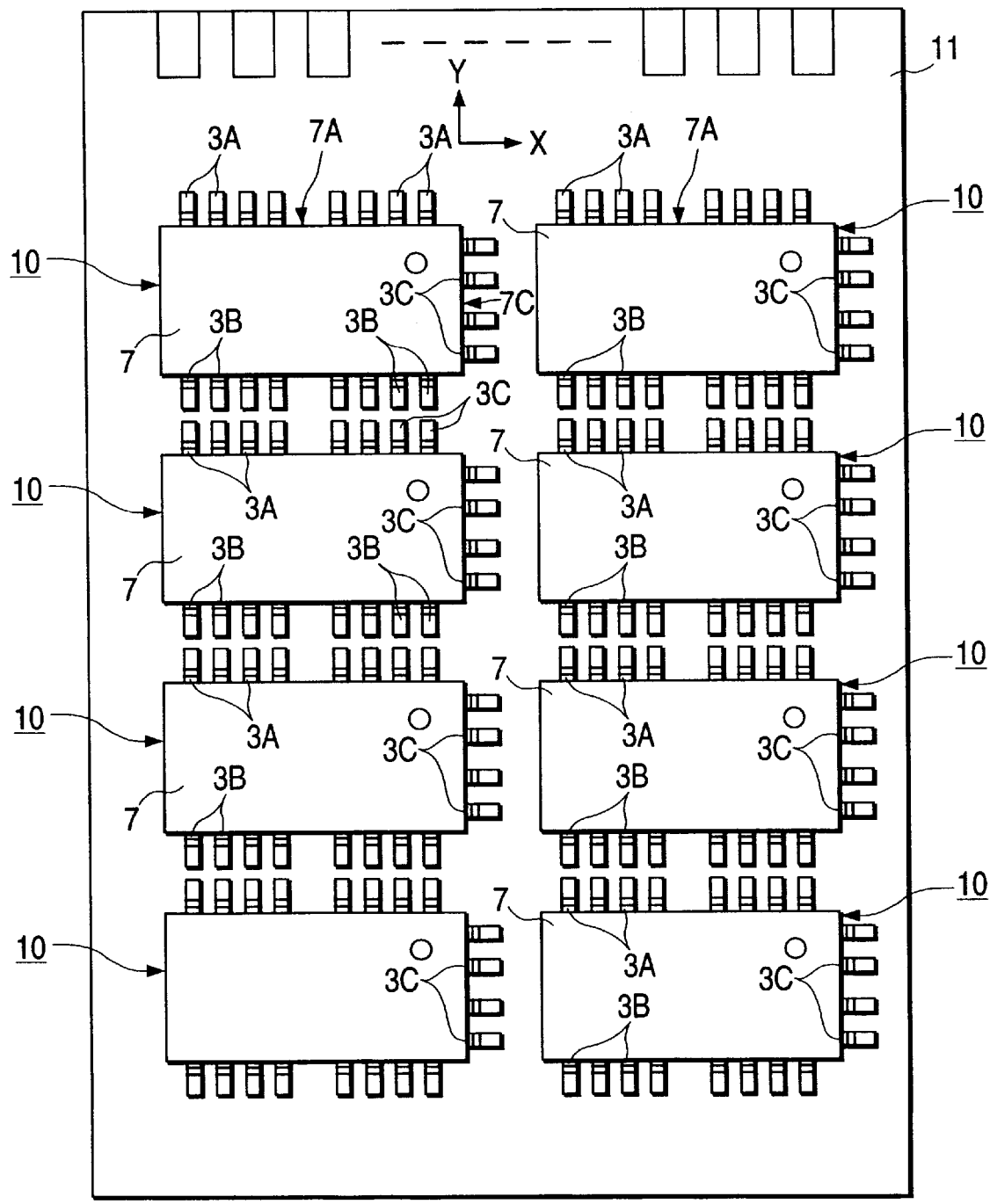
FIG. 6 is a top plan view showing a memory card in which semiconductor devices are mounted on the mounting face of a mounting board.
Figure 7:
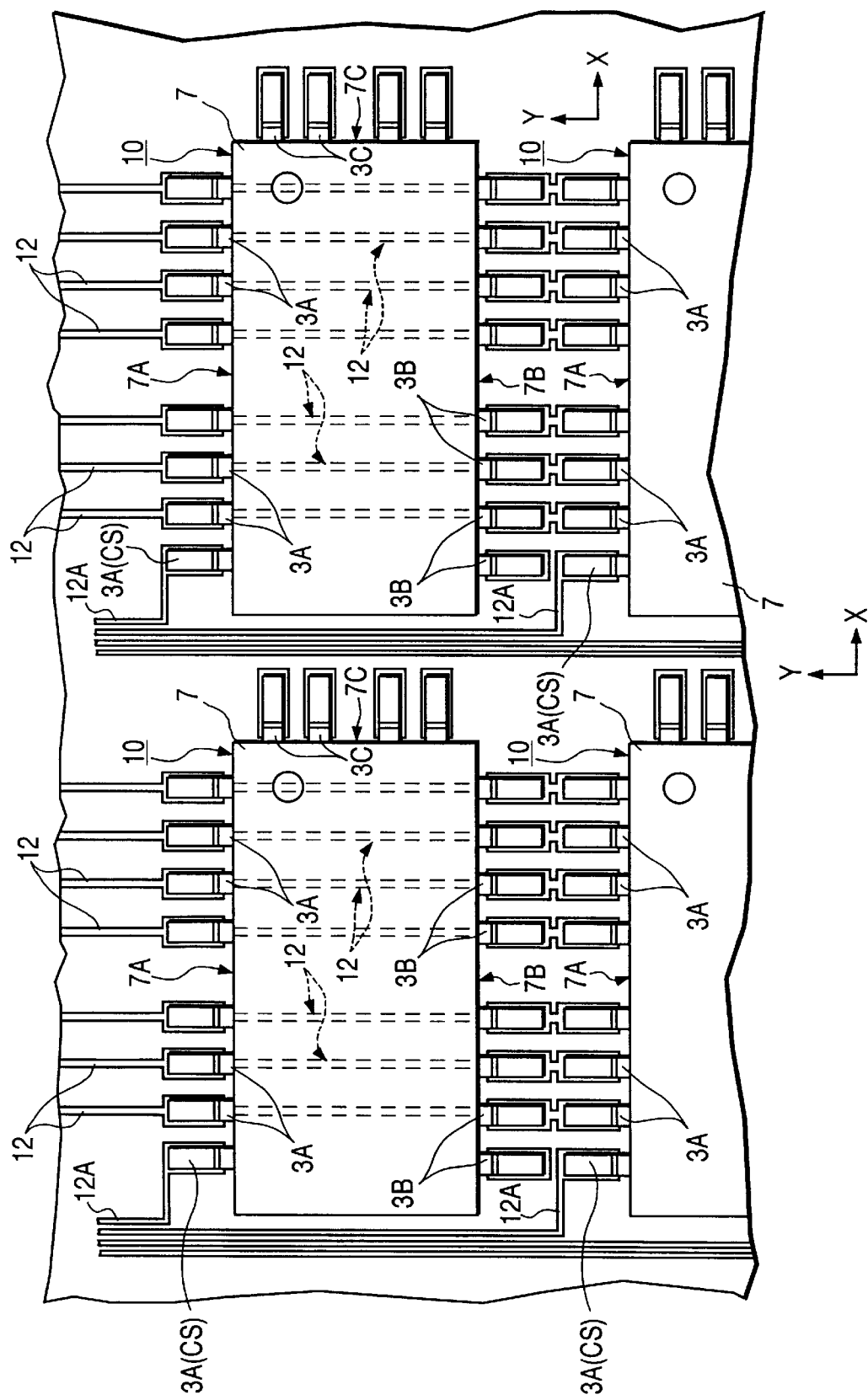
FIG. 7 is an enlarged top plan view showing an essential portion of the memory card.

In the aforementioned memory card (electronic unit), as shown in FIG. 6 (a top plan view), the semiconductor devices 10 are mounted in a matrix shape in the arrangement direction on the mounting face of the mounting board 11. Of these semiconductor devices 10, those devices mounted in the same direction (X-direction) as that of the one side face 7A of the package 7 are constructed, as shown in FIG. 7 (an enlarged top plan view of an essential portion of FIG. 6), such that the outer leads 3C arrayed on the side face 7C of the package 7 of the one semiconductor device 10 and the outer leads 3C arrayed on the side face 7C of the package 7 of the other semiconductor device 10 are not opposed to each other. As a result, when the one semiconductor device 10 and the other semiconductor device 10 are mounted in a packed state and even if they are displaced or extrusion of the solder occurs at the mounting time, no short-circuit takes place between the adjoining ones of the semiconductor devices 10 which are mounted in the direction perpendicular to the one side face 7A of the package 7. As a result, the semiconductor devices 10 can be mounted in the packed state in the same direction as that of the one side face 7A of the package 7, thereby making it possible to mount them at an accordingly high density.

Of the semiconductor devices 10 mounted in the same direction (the X-direction in the drawing) as that of the one side face 7A of the package 7, moreover, between the adjoining semiconductor devices 10, there are no other outer leads between the outer leads 3C arrayed on the side face 7C of the package 7 of the one semiconductor device 10 and the outer leads 3C arrayed on the side face 7C of the package 7 of the other semiconductor device 10 which have functions different from those of the outer leads 3C. Without roundabout routing of the wiring (not-shown) extending in the X-direction inside the mounting board, therefore, it is possible to electrically connect the outer leads 3C having the same functions of the individual semiconductor devices 10 which are mounted in the same direction as that of the one side face 7A of the package 7. As a result, the wiring region of the wiring extending in the X-direction can be reduced or eliminated, making it possible to mount the semiconductor devices 10 at an accordingly high density. In other words, the area where the wiring is routed in a roundabout way can be reduced to a minimum by linearly connecting the outer leads 3A of the semiconductor devices 10 adjoining each other in the Y-direction to each other through the surface wiring layer 12 of the mounting board and by linearly connecting the outer leads 3C of the semiconductor devices 10 adjoining each other in the X-direction to each other through only one specific layer of the internal wiring of the mounting board.

(Embodiment 3)

Figure 8:
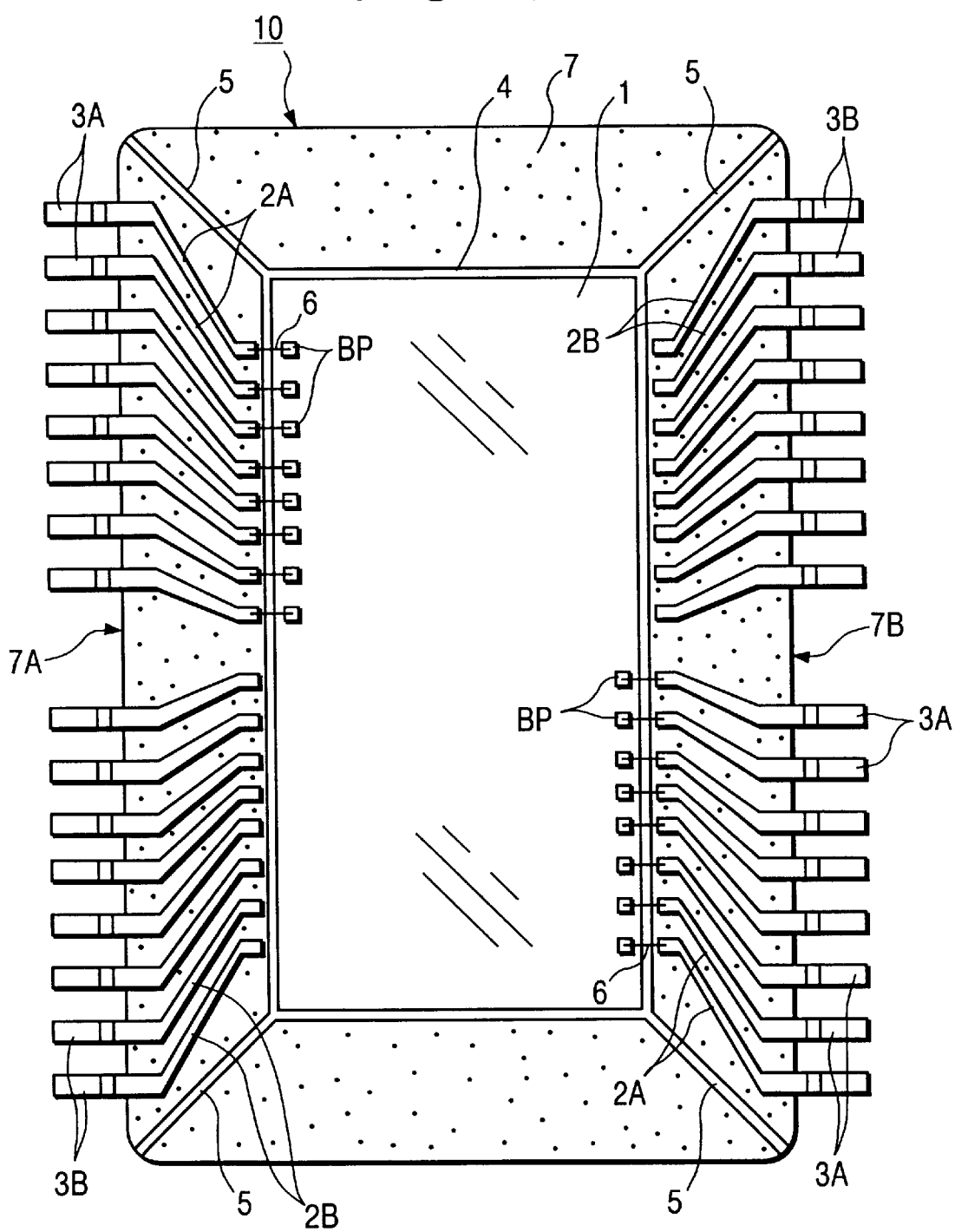
FIG. 8 is a top plan view showing the state in which the upper portion of a package of a semiconductor device of Embodiment 3 of the present invention is removed.

FIG. 8 is a top plan view showing the state in which the upper portion of the package of a semiconductor device of Embodiment 3 is removed.

As shown in FIG. 8, the semiconductor device 10 of the present embodiment is constructed of a two-way lead array structure in which a semiconductor chip 1 is encapsulated in a package 7 having a rectangular plane shape. A plurality of outer leads 3A electrically connected to the external terminals BP of the semiconductor chip 1 are arrayed on a part of the one side face 7A of the package 7 and along the one side face, and a plurality of outer leads 3B not electrically connected to the external terminals BP of the semiconductor chip 1 are arrayed on the other region of the one side face 7A of the package 7 and along the one side face. Further, a plurality of outer leads 3B not electrically connected to the external terminals BP of the semiconductor chip 1 are arrayed on a part of the other side face 7B opposed to the partial region of the one side face 7A of the package 7 and along the other side face, and a plurality of outer leads 3A electrically connected to the external terminals BP of the semiconductor chip 1 are arrayed on the other region of the other side face 7B opposed to the other region of the one side face 7A of the package 7 and along the other side face.

When a plurality of the semiconductor devices 10 thus constructed are mounted in a matrix shape in one direction on the mounting face of the mounting board, between the adjoining ones 10 of the semiconductor devices 10 mounted in the direction perpendicular to the one side face 7A of the package 7, like Embodiment 1, the outer leads 3A electrically connected to the external terminals BP of the semiconductor chip 1 are not opposed to each other. Between the adjoining ones 10 of the semiconductor devices 10 mounted in the direction perpendicular to the one side face 7A of the package 7, moreover, there are no outer leads between the outer leads 3A of the one semiconductor device 10 and the outer leads 3A of the other semiconductor device 10 having functions different from those of the outer leads 3A. As a result, like Embodiment 1, the semiconductor devices 10 can be mounted at a high density.

(Embodiment 4)

Figure 9:
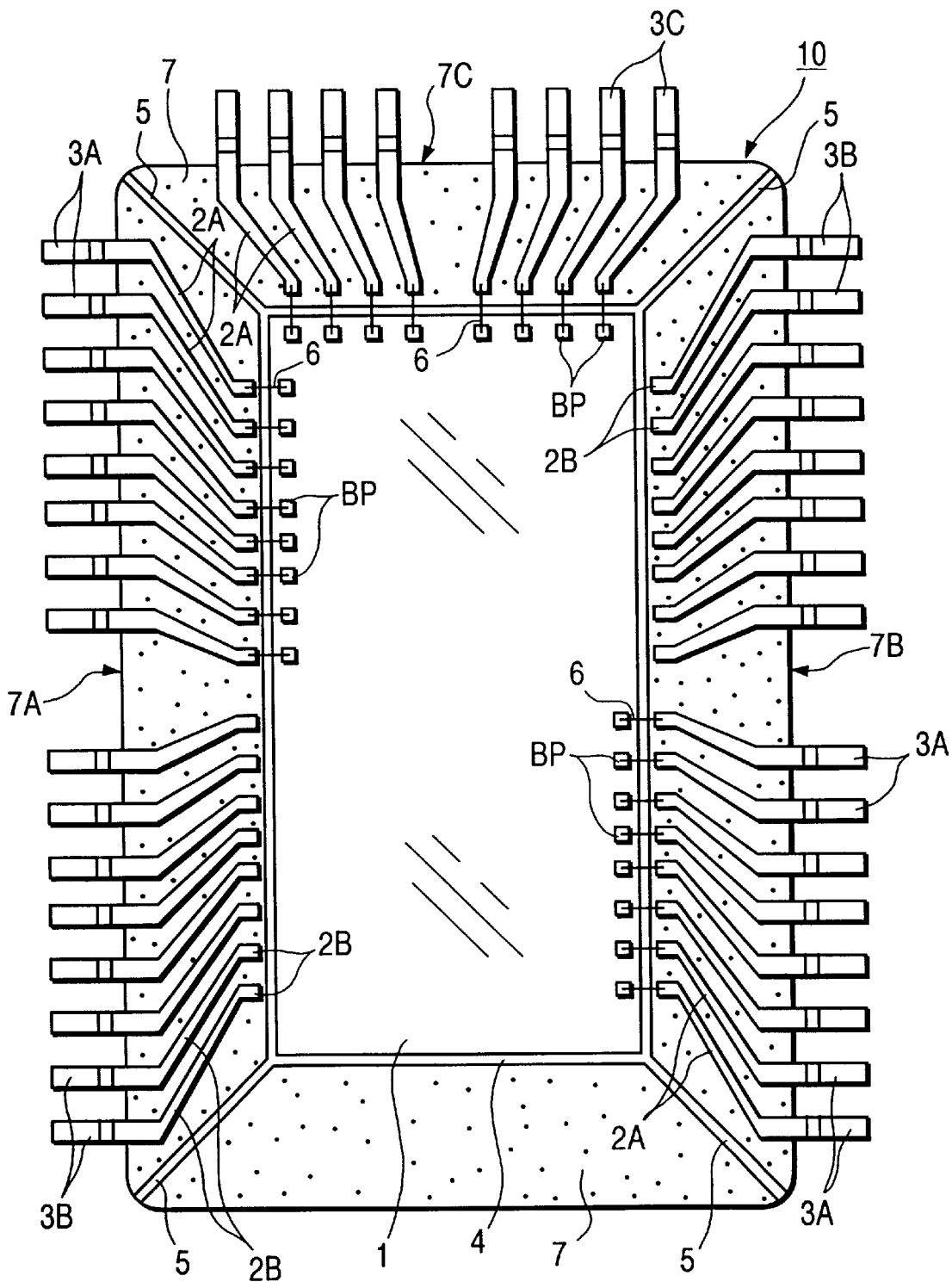
FIG. 9 is a top plan view showing the state in which upper portion of a package of a semiconductor device of Embodiment 4 of the present invention is removed.

FIG. 9 is a top plan view showing the state in which the upper portion of the package of a semiconductor device of Embodiment 4 is removed.

As shown in FIG. 9, the semiconductor device 10 of Embodiment 4 is constructed of a three-way lead array structure in which a semiconductor chip 1 is encapsulated in a package 7 having a rectangular plane shape. A plurality of outer leads 3A electrically connected to the external terminals BP of the semiconductor chip 1 are arrayed on a part of the one side face 7A of the package 7 and along the one side face, and a plurality of outer leads 3B not electrically connected to the external terminals BP of the semiconductor chip 1 are arrayed on the other part of the one side face 7A of the package 7 and along the one side face. A plurality of outer leads 3B not electrically connected to the external terminals BP of the semiconductor chip 1 are arrayed on a part of the other side face 7B opposed to a part of the one side face 7A of the package 7 and along the other side face, and a plurality of outer leads 3A electrically connected to the external terminals BP of the semiconductor chip 1 are arrayed on the other part of the other side face 7B opposed to the other part of the one side face 7A of the package 7 and along the other side face. Further, a plurality of outer leads 3C electrically connected to the external terminals BP of the semiconductor chip 1 are arrayed along one side face 7C of the two side faces perpendicular to the one side face 7A of the package 7.

When a plurality of the semiconductor devices 10 thus constructed are mounted in a matrix shape in a direction on the mounting face of the mounting board, between the adjoining ones 10 of the semiconductor devices 10 mounted in the same direction as that of the one side face 7A of the package 7, like the foregoing Embodiment 2, the outer leads 3A electrically connected to the external terminals BP of the semiconductor chip 1 are not opposed to each other. As a result, like Embodiment 1, the semiconductor devices 10 can be mounted at a high density.

(Embodiment 5)

Figures 15, 16:
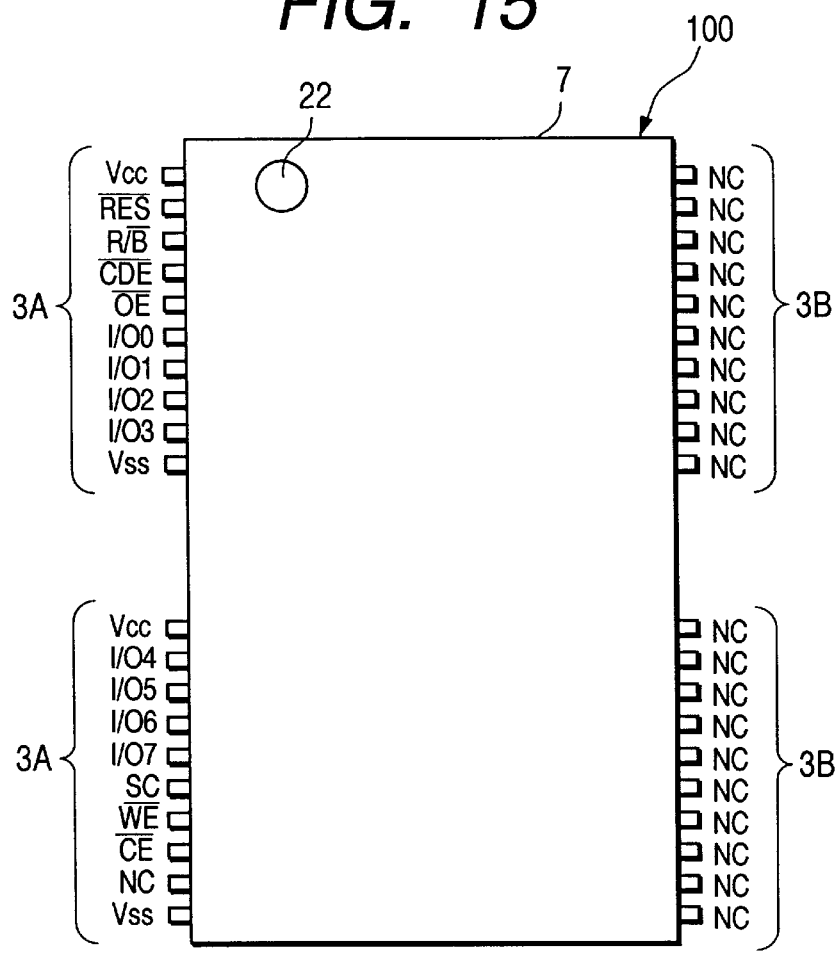
FIG. 15 is an external view of a semiconductor device of Embodiment 5 of the present invention.
FIG. 16 is a table for explaining the names and functions of lead pins in the device of FIG. 15.

FIG. 15 is a top plan view showing a semi-conductor device (package) of Embodiment 5.

Figure 17:
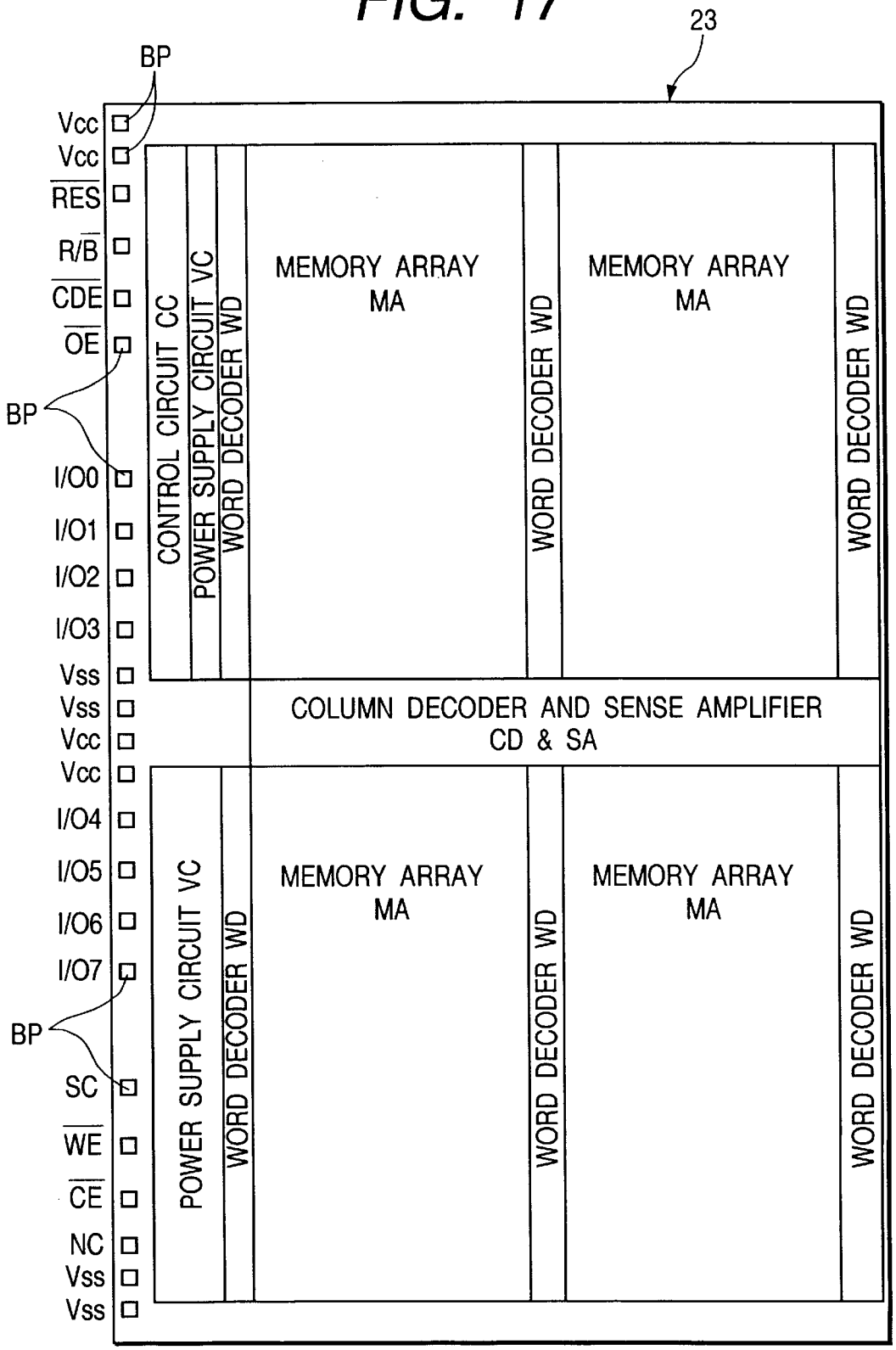
FIG. 17 is a block diagram showing a flash memory chip mounted in the semiconductor device of FIG. 15.

A semiconductor device 100 is constructed, as in Embodiment 1, to have a TSOP structure, and a semiconductor chip 23 mounted with a flash memory (EEPROM) shown in FIG. 17 is encapsulated in a package 7. Over the major surface of the semiconductor chip 23, there are formed four memory arrays MA each having a plurality of memory cells arranged in a matrix shape, word decoders WD, column decoders CD and sense amplifiers SA for selecting a predetermined memory cell from each memory array MA, a power supply circuit VC having a power voltage generator and a booster circuit, and a control circuit CC serving as an interface with an external device such as an input/output circuit. Moreover, the bonding pads BP are arranged along only one long side of the semiconductor chip 23, and the peripheral circuits including the power supply circuit VC and the control circuit CC are positively arranged in the vicinities of the bonding pads BP to equalize the signal wiring lengths in the chip and to reduce the chip size. The individual bonding pads BP correspond to power supply pins and signal pins Vcc, Vss, I/O and so on, as shown in FIGS. 15 and 16, and are connected through the wires 6 to the inner leads 2A of the corresponding power supply pins and signal pins. The individual pin functions are shown in FIG. 16, and the NC pins (3B) are in an electrically floating state in the package.

Figure 18:
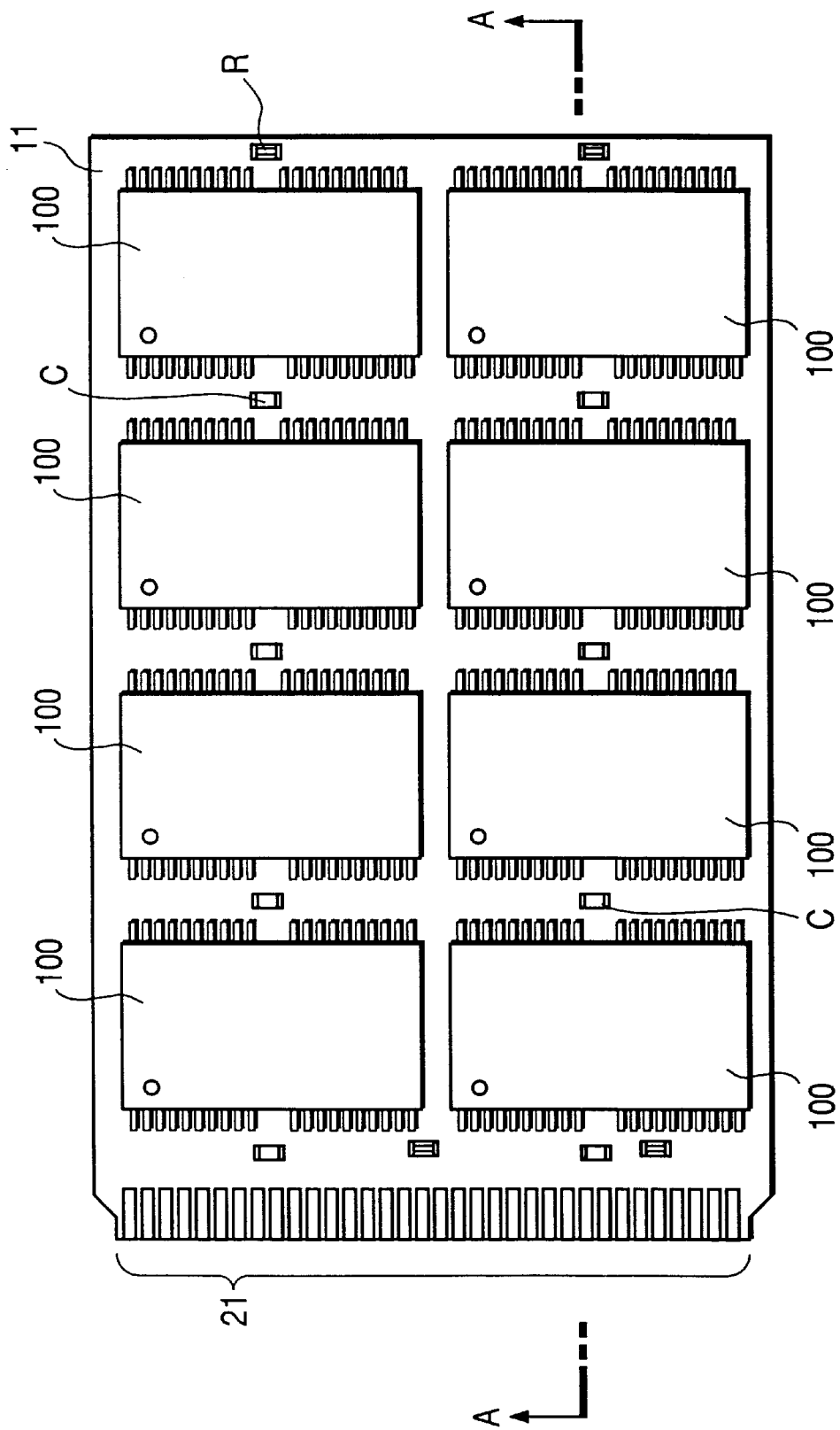
FIG. 18 is a top plan view showing the front side of the memory card of the present invention.
Figure 19:
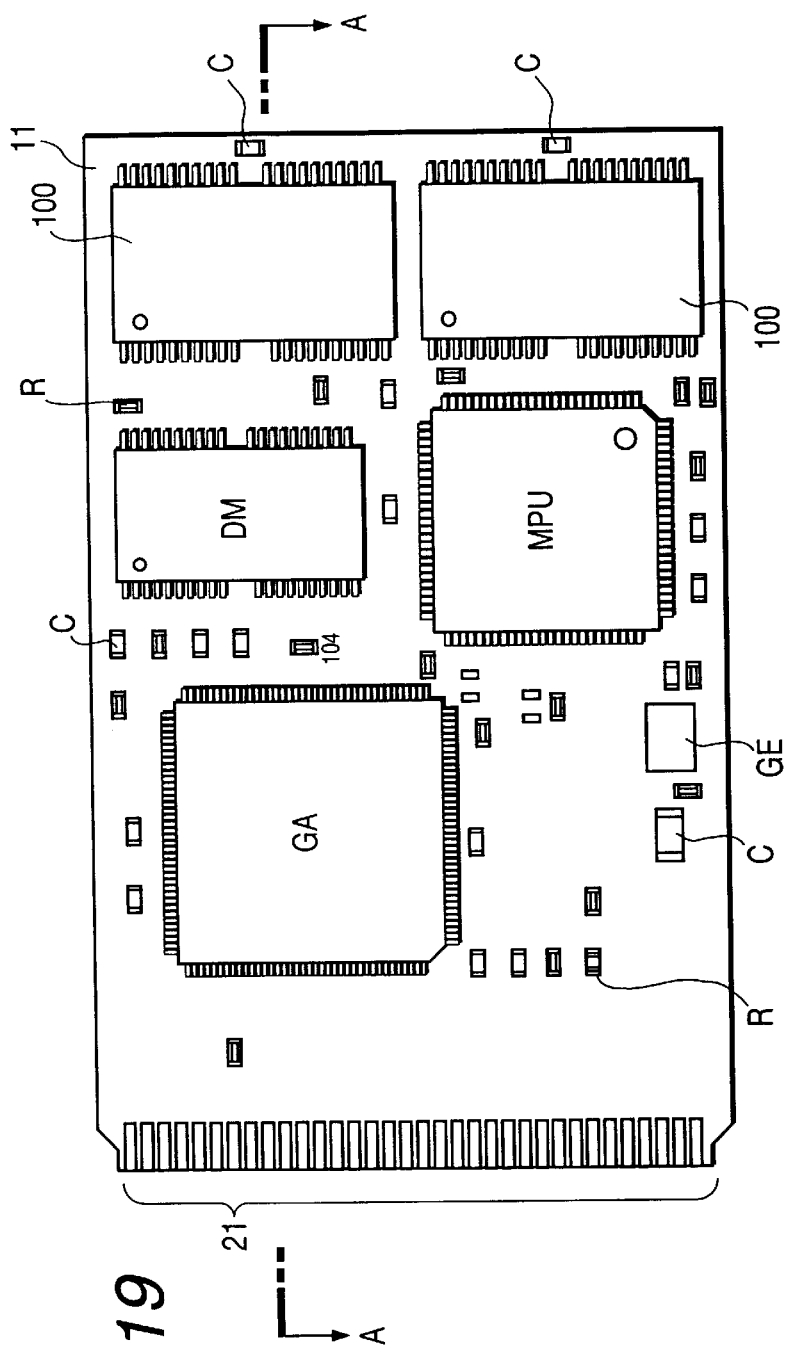
FIG. 19 is a top plan view showing the back side of the memory card of the present invention.
Figure 20:
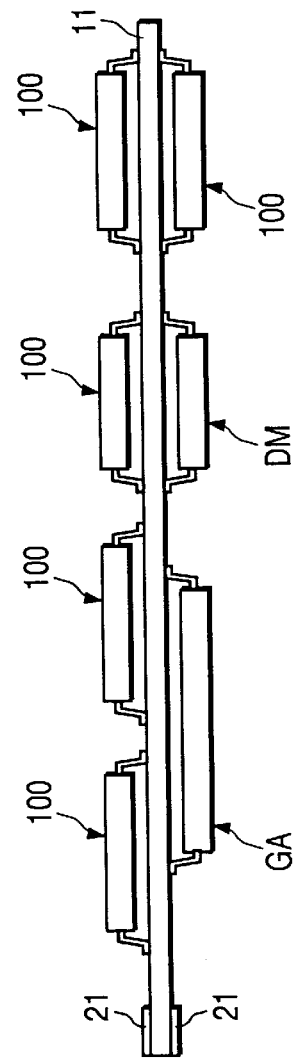
FIG. 20 is a section taken along lines A—A of FIGS. 18 and 19.

The aforementioned semiconductor devices 100 are mounted on the mounting board 11, as shown in FIGS. 18 and 19, constituting the body of the memory card. FIG. 18 is a top plan view showing the front side of the mounting board 11, and FIG. 19 is a top plan view showing the back side, opposed to the front surface side, of the mounting board 11. FIG. 20 is a section taken along lines A—A of FIGS. 18 and 19.

On the back side of the mounting board 11, there are mounted a QFP package GA mounted with a gate array chip, a QFP package MPU mounted with a microcomputer, and a TSOP package DM mounted with a DRAM chip. On the mounting board 11, moreover, there are mounted a chip capacitor C and a chip resistor R for matching the impedance, and a clock generator GE for feeding clock signals.

Figure 21:
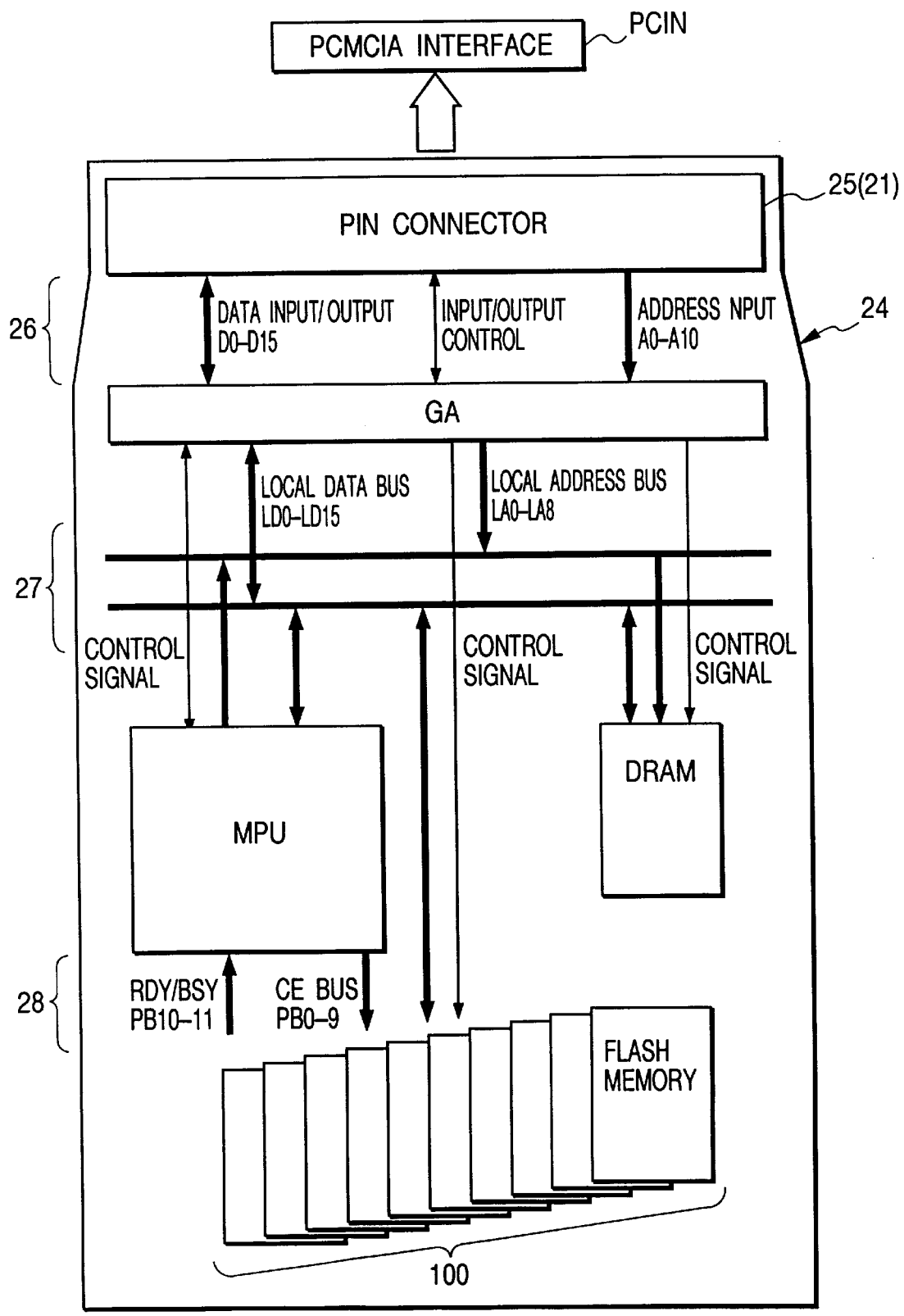
FIG. 21 is a block diagram showing the system configuration of a memory card (ATA card) of the present invention.

The packages thus mounted on the mounting board 11 constitute an ATA (AT Attachment) card 24, as shown in FIG. 21. The system configuration of the ATA card 24 will be briefly described.

The ATA (AT Attachment) card 24 of FIG. 21 conforms to the interface and protocol which are used when an AT compatible machine makes access to a hard disk and is standardized by the PCMCIA (Personal Computer Memory Card International Association).

Numeral 25 designates a pin connector section of the ATA card, corresponding to the external terminals 21, through which signals are exchanged with a PC (Personal Computer) or a PDA (Personal Digital Assistant). The number, names and Nos. of the external terminals are determined by the PCMCIA.

The data and addresses from the outside are introduced at first through signal lines 26 into the gate array GA. This gate array GA controls the PCMCIA interface (PCIN), the microcomputer MPU, the DRAM (Dynamic Random Access Memory), the flash memory 100, and the data transfer between the flash memory 100 and the PCMCIA interface. The exchanges of data and addresses between the individual elements in the card are executed through the local data bus and the local address bus designated by numeral 27.

The MPU controls the data according to commands from the outside. The data from the outside are fed through the DRAM to the flash memory 100 or from the flash memory 100 to the DRAM so that they may be processed, i.e., written in or read out at high rate. Moreover, the MPU provides control through a CE (Chip Enable) bus 28 to select which flash memory 100 data are to be written in or read out. In order to improve the reliability of the data stored in the flash memory 100, moreover, the MPU controls the ECC (Error Check Correction) processing (control of the number of rewrites of the individual sectors, control of the access to defective sectors) and the ware leveling (averaging the number of rewrites of the individual sectors).

Although the invention made by us has been specifically described, with reference to various Embodiments, the invention should not be limited thereto but, can naturally be modified in various manners without departing from the gist thereof.

For example, the present invention can be applied to a semiconductor device in which the semiconductor chip is encased in a package made of ceramic.

Moreover, the present invention can be applied to a semiconductor device having an LOC (Load On Chip) structure or a COL (Chip On Lead) structure.

Moreover, the present invention can be applied to a semiconductor device in which there is mounted a semiconductor chip constructed of a memory circuit system made up of a SRAM (Static Random Access Memory), an EPROM (Electrically Programmable Read Only Memory), an EEPROM (Electrically Erasable Programmable ROM) and a flash memory (flash EEPROM).

What is claimed is:

1. A semiconductor device comprising:
   a rectangular-shaped mounting board comprised of a pair of long sides and a pair of short sides extending perpendicular to said long sides, said mounting board having a plurality of wirings on its major surface, said wirings extending along said long sides, respectively; and a plurality of semiconductor memory devices mounted on said major surface of said mounting board, each of said semiconductor memory devices including:

a rectangular-shaped semiconductor chip having a plurality of external terminals on its major surface, said semiconductor chip having a pair of long sides extending in a first direction and a pair of short sides extending in a second direction generally perpendicular to said first direction;

said external terminals being arranged along one of said of long sides of the semiconductor chip;

a plurality of first leads arranged along said one of said pair of long sides of the semiconductor chip, said first leads each including inner lead portions and outer lead portions, and the end portions of said inner lead portions being directly connected to corresponding external terminals;

a plurality of second leads arranged along the other of said pair of long sides of the semiconductor chip, each said second leads are arranged opposite to one of said first leads, respectively, and including inner lead portions and outer lead portions, and said second lead portions being not directly connected to said semiconductor chip;

a sealing body in which said semiconductor chip, the inner lead portions of said first leads, and the inner lead portions of said second leads are packaged, said sealing body being formed into a rectangular shape having a pair of long sides extending in said first direction and a pair of short sides extending in said second direction, the outer leads of said first leads protruding from one of the pair of long sides of said sealing body, and the outer leads of said second leads protruding from the other of said pair of long sides, wherein one of said first leads and one of said second leads are connected by one of said wirings, respectively.

2. A semiconductor device according to claim 1, wherein said one of said second leads is arranged opposite to said one of said first leads.

3. A semiconductor device according to claim 1, wherein all said second leads are arranged opposite to said first leads, respectively.

4. A semiconductor device according to claim 1, wherein said plurality of semiconductor memory devices are arranged along one of said long sides of said mounting board.

5. A semiconductor device according to claim 4, wherein said plurality of wirings are extended under said plurality of semiconductor memory devices.

6. A semiconductor device according to claim 5, wherein said plurality of wirings are arranged to parallel each other.

7. A semiconductor device according to claim 1, wherein one of said semiconductor memory devices and another one of said semiconductor devices are adjoined each other, said second leads of said one of said semiconductor memory devices and said first leads of said another one of said semiconductor memory devices being arranged closely adjacent to one another.

8. A semiconductor device according to claim 7, wherein said first leads and said second leads of said semiconductor memory devices are directly connected by said one of said wirings.

9. A semiconductor device according to claim 1, wherein said plurality of first leads and said second leads are bonded to said mounting board by solder.

10. A semiconductor device according to claim 1, further comprising:

a plurality of connector terminals arranged along one of said shorter sides of said mounting board.

11. A semiconductor device according to claim 1, wherein eight of said semiconductor memory devices are mounted on said mounting board.

12. A semiconductor device according to claim 1, wherein said one of said wirings commonly inputs a signal to said plurality of devices.

13. A semiconductor device comprising:

a mounting board having a plurality of wirings on its major surface; and a plurality of semiconductor memory devices mounted on said major surface of said mounting board, each of said semiconductor memory devices including:

a rectangular-shaped semiconductor chip having a plurality of external terminals on its major surface, said semiconductor chip having a pair of long sides extending in a first direction and a pair of short sides extending in a second direction perpendicular to said first direction, and said external terminals being arranged along one of said pair of long sides of said semiconductor chip;

a plurality of first leads arranged along said one of said pair of long sides of said semiconductor chip, said first leads each including inner lead portions and outer lead portions, and the end portions of said inner lead portions being directly connected to corresponding external terminals;

a plurality of second leads arranged along the other of said pair of long sides of said semiconductor chip, each said second leads being arranged opposite to one of said first leads, respectively, and including inner lead portions and outer lead portions, and said second lead portions being not directly connected to said semiconductor chip;

a sealing body in which said semiconductor chip, the inner lead portions of said first leads and the inner portions of said second leads are packaged, said sealing body being formed into a rectangular shape having a pair of long sides extending in said first direction and a pair of short sides extending in said second direction;

the outer lead portions of said first leads protruding from one of the pair of long sides of said sealing body, and the outer lead portions of said second leads protruding from the other of said pair of long sides of said sealing body;

wherein one of said first leads and one of said second leads which is opposite to said one of said first leads are connected to one another by a same wiring among said plurality of wirings.

14. A semiconductor device according to claim 13, wherein all said second leads are arranged in opposing relationship to said first leads, respectively.

15. A semiconductor device according to claim 13, wherein said plurality of wirings are extended under said plurality of semiconductor memory device and arranged along said second direction.

16. A semiconductor device according to claim 15, wherein said plurality of wirings are arranged to parallel each other.

17. A semiconductor device according to claim 15, wherein one of said semiconductor memory devices and another one of said semiconductor memory devices are adjoined to each other and mounted on said mounting board, said second leads of said one of said semiconductor memory devices and said first leads of said another one of said semiconductor memory devices being arranged closely adjacent to one another.

18. A semiconductor device according to claim 17, wherein said first leads and second leads of said semiconductor memory devices are connected by said same wiring.

19. A semiconductor device according to claim 13, wherein said plurality of first leads and said second leads are bonded to said mounting board by solder.

20. A semiconductor device according to claim 13, wherein eight semiconductor memory devices are mounted on said mounting board.

21. A semiconductor device according to claim 13, wherein said same wiring commonly inputs a signal to said plurality of semiconductor memory devices.

22. A semiconductor device comprising:
- a mounting board having a pair of long sides and a plurality of wirings on its major surface; and
- a first semiconductor memory device and a second semiconductor memory device mounted on said major surface of said mounting board,
- each of said first and said second semiconductor memory devices including:
  - a rectangular-shaped semiconductor chip having a pair of long sides extending in a first direction and a pair of short sides extending in a second direction perpendicular to said first direction;
  - a plurality of external terminals arranged on a major surface of said semiconductor chip and along one of said pair of long sides of said semiconductor chip;
  - a plurality of first leads arranged along one of said pair of long sides of said semiconductor chip, said first leads each including inner lead portions and outer lead portions, and the end portions of said inner lead portions being directly connected to corresponding ones of said external terminals;
  - a plurality of second leads arranged along the other of said pair of long sides of said semiconductor chip, each said second leads being arranged opposite to one of said first leads, respectively, and including inner lead portions and outer lead portions, and said second leads being not directly connected to said semiconductor chip;
  - a sealing body in which said semiconductor chip, the inner lead portions of said first leads and the inner lead portions of said second leads are packaged, said sealing body being formed into a rectangular shape having a pair of long sides extending in said first direction and a pair of short sides extending in said second direction;
- the outer lead portions of said first leads protruding from one of the pair of long sides of said sealing body, and the outer lead portions of said second leads protruding from the other of said pair of long sides of said sealing body,
- wherein one of said first leads of said first memory device, one of said first leads of said second memory device and one of said second leads of said first memory device are all connected to a common wiring among said plurality of wirings.

23. A semiconductor device according to claim 22, wherein said common wiring is extended along in a direction where said first semiconductor device and said second semiconductor device are arranged.

24. A semiconductor device according to claim 23, wherein said common wiring is extended along said long sides of said semiconductor chip, linearly.

25. A semiconductor device according to claim 22, wherein said second leads of said first and said second semiconductor device are arranged opposite to said first leads of said first and said second semiconductor device, respectively.

26. A semiconductor device according to claim 22, wherein said wirings are extended under said first and said second semiconductor devices.

27. A semiconductor device according to claim 26, wherein said plurality of wirings are arranged to parallel each other.

28. A semiconductor device according to claim 22, wherein said first and said second semiconductor memory devices are adjoined to each other, said second leads of said first semiconductor memory device and said first leads of said second semiconductor memory device are arranged closely adjacent to one another.

29. A semiconductor device according to claim 22, wherein said plurality of outer lead portions of said first and said second leads are bonded to said mounting board by solder.

30. A semiconductor device according to claim 22, further comprising:
- a plurality of connector terminals arranged along one of said shorter sides of said mounting board.

31. A semiconductor device according to claim 22, wherein said wirings commonly input signals to said first and said second semiconductor memory devices.

* * * * *